United States Patent [19]
Krijn et al.

[11] Patent Number: 5,965,894
[45] Date of Patent: Oct. 12, 1999

[54] METHOD OF OPERATING A PARTICLE-OPTICAL APPARATUS

[75] Inventors: Marcellinus P.C.M. Krijn; Alexander Henstra, both of Eindhoven, Netherlands

[73] Assignee: U. S. Philips Corporation, New York, N.Y.

[21] Appl. No.: 08/982,880

[22] Filed: Dec. 2, 1997

[30] Foreign Application Priority Data

Dec. 3, 1996 [EP] European Pat. Off. ............... 96203421

[51] Int. Cl.$^6$ .................................................. H01J 37/153
[52] U.S. Cl. ...................................................... 250/396 R
[58] Field of Search ......................... 250/396 R, 396 ML

[56] References Cited

U.S. PATENT DOCUMENTS 5,838,011  11/1998  Krijn et al. ......................... 250/396 R

*Primary Examiner*—Kiet T. Nguyen
*Attorney, Agent, or Firm*—Fulbright & Jaworski LLP; Michael O. Scheinberg

[57] ABSTRACT

Electron-optical, rotationally-symmetrical lenses inevitably exhibit spherical and chromatic aberration which usually determine the limit of the resolution. Such lens aberrations cannot be eliminated by compensation by means of rotationally-symmetrical fields. In order to enhance the resolution nevertheless, it has already been proposed to reduce said lens aberrations by means of a Wien-type corrector. Such a configuration must satisfy very severe requirements as regards manufacturing precision, mechanical and electrical stability and alignment of the various elements relative to one another. Consequently, it is extremely difficult to perform readjustment of the electron-optical apparatus by means of such a corrector in the case of changing circumstances. According to the invention there is provided a combination of a correction unit and a doublet to be corrected. By constructing the objective to be corrected as a doublet 5 and by independently controlling the two lenses 6 and 8 of the doublet 5, the setting of the correction unit 28 can remain unchanged, it being possibly to vary the free object distance and the electron voltage nevertheless during operation of the electron-optical apparatus. FIG. 1.

10 Claims, 3 Drawing Sheets

METHOD OF OPERATING A PARTICLE-OPTICAL APPARATUS

The invention relates to a method of operating a particle-optical apparatus, which apparatus includes:

a particle source for emitting a beam of electrically charged particles which travel along an optical axis of the apparatus in order to irradiate an object in the apparatus by means of the particle beam, which particle source includes an acceleration unit for accelerating the beam of electrically charged particles by means of an acceleration voltage, a focusing lens unit which is formed by a combination of at least two particle lenses and serves to focus the beam of electrically charged particles, and a correction device for correcting chromatic and/or spherical aberration of the focusing lens unit.

The invention also relates to a particle-optical apparatus arranged to carry out the method and to an assembly which consists of a focusing lens unit and a correction device for the correction of lens aberrations of the focusing lens unit and is intended for use in a particle-optical apparatus arranged to carry out the method.

A particle-optical apparatus of this kind is known from European Patent No. 0 281 743.

BACKGROUND OF THE INVENTION

Generally speaking, particle-optical apparatus, such as electron microscopes or electron-lithography apparatus, are arranged to irradiate an object to be studied or worked by means of a beam of electrically charged particles (usually an electron beam) which is produced by means of a particle source such as a thermionic electron source or an electron source of the field-emission type. Irradiation of the object may be aimed at imaging it for the purpose of examination in such apparatus (specimens in electron microscopes) or may be aimed at forming very small structures on the object, for example for microelectronics (electron lithography apparatus). In both cases focusing lenses are required for focusing the electron beam.

The electron beam can in principle be focused by means of two methods. According to the first method the area to be imaged of a specimen to be examined is more or less uniformly irradiated by the electron beam and an enlarged image of the specimen is formed by means of the focusing lens unit. The focusing lens unit is in that case the objective lens of an imaging lens system; the resolution of the objective lens then determines the resolution of the apparatus. Apparatus of this kind are known as Transmission Electron Microscopes (TEM). According to a second focusing method, the emissive surface of the electron source, or a part thereof, is imaged, generally strongly reduced, on the specimen to be examined (in the Scanning Electron Microscope or SEM) or on an object on which the microstructure is to be formed (in the lithography apparatus). The image of the electron source (the "spot" which is moved across the surface of the object in a predetermined scanning pattern by means of, for example deflection coils) is again formed by means of an imaging lens system. In the latter case the focusing lens unit is the objective lens of the spot-forming lens system; the resolution of this objective lens then decides the spot size of the beam and hence the resolution of the apparatus.

The lenses used in all apparatus of this kind are usually magnetic lenses, but may also be electrostatic lenses. Both types of lens are practically always rotationally symmetrical lenses. The behavior of such lenses inevitably is not ideal, i.e. they exhibit lens aberrations, among which the so-called spherical aberration and the chromatic aberration are usually decisive in respect of resolution of the lens; these lens aberrations thus determine the limit of the resolution of the known electron-optical apparatus. According to a fundamental theorem of particle-optics, such lens aberrations cannot be eliminated by compensation utilizing rotationally symmetrical electrical or magnetic fields.

In contemporary electron-optical apparatus, notably in scanning particle-optical apparatus comprising a spot-forming objective lens (the so-called Scanning Electron Microscope or SEM), there is a tendency to select the acceleration voltage of the electron beam so as to have a value which is lower than was customary thus far, i.e. of the order of magnitude of from 0.5 kV to 5 kV instead of the previously customary voltage of the order of magnitude of 30 kV or more. The reason for doing so is that at such comparatively low acceleration voltages the charging of non-conductive specimens (such as photoresist material in the case of manufacture of electronic integrated circuits) is substantially reduced; moreover, at these low voltages the so-called topographic contrast is substantially enhanced. At such low acceleration voltages the chromatic aberration is the major lens aberration, so the decisive factor in respect of resolution of the particle-optical apparatus. (This can be readily understood by considering the fact that the chromatic aberration is proportional to $\Delta U/U$, in which $\Delta U$ is the non-variable energy spread in the electron beam and U is the nominal acceleration voltage; this factor, therefore, increases as U is decreased.)

In order to enhance the resolution of the particle-optical apparatus nevertheless, it is already known to reduce said lens aberrations by means of a correction device having a non-rotationally symmetrical structure. Such a structure is known, for example from European Patent No. 0 373 399. The structure described therein is formed by a so-called Wien-type corrector, i.e. a structure in which a uniform electric field and a uniform magnetic field, extending perpendicularly thereto, are both oriented perpendicularly to the optical axis of the apparatus. This corrector is provided with a number of multipoles for the correction of the spherical aberration as well as the chromatic aberration, i.e. an electrical and a magnetic quadrupole, an electrical and a magnetic hexapole, and an electrical and/or a magnetic octupole.

An embodiment of the correction device according to the cited European Patent (described notably with reference to FIG. 5 and denoted therein by the reference numeral 20) enables correction of the chromatic aberration. This embodiment consists of a multipole unit which is formed by a number of electrical and magnetic poles whose pole faces are axially oriented, i.e. extend parallel to the optical axis of the apparatus. Each of said poles can be separately excited; by suitably choosing the individual excitations, therefore, a multipole unit thus constructed can form, as desired, a uniform electrical field extending perpendicularly to the optical axis and a uniform magnetic field which extends perpendicularly thereto, both fields extending perpendicularly to the optical axis; electrical and magnetic quadrupole fields, hexapole fields and an electrical and/or a magnetic octupole field can be superposed thereon.

In such a comparatively complex correction device it is extremely difficult to find the correct electrical and magnetic adjustment for the (very accurate) generation of said multipole fields. This difficulty becomes more serious as the number of multipole fields to be generated is greater, because each of said fields must have and retain exactly the adjusted correct value.

The cited European Patent No. 0 281 743 discloses a particle-optical apparatus which is provided with a focusing lens unit which is formed by a combination of at least two particle lenses and serves to focus a beam of electrically charged particles, and with a correction device for correcting chromatic and/or spherical aberration of the focusing lens unit. The correction unit described therein consists of at least four successively arranged octupole elements or twelve-pole elements. Therefore, in this correction device it will also be extremely difficult to find the correct electric and magnetic setting for generating said multipole fields.

SUMMARY OF THE INVENTION

It is an object of the invention to provide a method of operating a particle-optical apparatus of the kind set forth in which the requirements in respect of electrical and magnetic adjustment and reproducibility affect the operation of the particle-optical apparatus to a substantially smaller extent.

To achieve this, the method according to the invention is characterized in that as the focusing circumstances change, the focusing of the beam is adapted by changing the excitation of at least two of the electromagnetic lenses (6, 8) of the focusing lens unit (5), the product $C_t K_t^2$ $$C_t K_t^2 \sqrt{\frac{U_c}{U_{final}}}$$

being kept constant for this adaptation, $C_t$ being the coefficient of chromatic aberration of the focusing lens unit (5), $K_t^2$ the square of the strength of the focusing lens unit (5), and $\sqrt{U_c/U_{final}}$ the root of the ratio of the voltage of the electrons in the correction unit (28) to the voltage of the electrons on the object (14).

This object is achieved by the invention in that once the desired setting of the correction device has been obtained, it remains unchanged and that in the event of changing focusing circumstances, so for example in the case of a different acceleration voltage for the electrically charged particles and/or a different working distance from the object to be irradiated, the beam of electrically charged particles is focused by way of a specific adaptation of the excitation of the lenses in the focusing lens unit. The specific adaptation of the excitation consists in that (ignoring changes in the electron energy) said product $C_t K_t^2$ of the focusing lens unit (which product is equal to and opposes that of the correction unit in the case of complete correction of the chromatic aberrations) remains the same during this adaptation. Consequently, the adjustment of the correction unit may also remain unchanged.

A preferred version of the method according to the invention is also characterized in that the correction device is provided with pole faces for producing a uniform electrical field and a uniform magnetic field which extends perpendicularly thereto, both of said dipole fields also extending perpendicularly to the optical axis of the apparatus, which correction device is also provided with pole faces for producing an electrical quadrupole field, said pole faces extending substantially parallel to the optical axis of the apparatus, and the excitation of the correction device,
the excitation of the focusing lens unit,
the velocity of the electrically charged particles,
and the length L, in the direction of the optical axis, of the pole faces determining the multipole fields are chosen so that for said length L it holds that it is substantially equal to $(2\pi^2 n^2)/(K_t^2 C_t)$, where n is the number of periods of the sinusoidal trajectory of the particles of the beam in the correction device, $K_t$ is the strength of the focusing lens to be corrected, and $C_t$ is the coefficient of chromatic aberration of this lens.

This embodiment of the invention is based on the idea that such an excitation can be found for the various multipoles in the correction device that the chromatic aberration is corrected and while using only dipole fields and quadrupole fields. Consequently, only a limited number of power supplies is required, so that the number of variables in the adjustment of the correction device is substantially smaller than in the correction device known from the cited European Patent No. 0 373 399.

The correction device thus constructed and adjusted, however, provides fill correction of the chromatic aberration for only one value of the energy of the beam of charged particles. When the user of the particle-optical apparatus wishes to study or work an object requiring a different particle energy or a different working distance, there will be a change of the strength of the focusing lens to be corrected and hence a change of the variable $(2\pi^2 n^2)/(K_t^2 C_t)$. This would necessitate a (time consuming) and intricate) change of the adjustment of the correction device; however, as a result of the use of the invention, the adjustment of the correction device can now remain unchanged. It is to be noted that a correction device in which the length L of the pole faces governing the multipole fields is chosen so that it equals $(2\pi^2 n^2)/K_t^2 C_t)$ is described per se in Applicant's previously filed but not yet published European Patent Application No. 96 20 26 38.1 (PHN 15.991).

A further version of the method according to the invention is characterized in that such a strength is imparted to the dipole fields of the correction device that the number of periods n of the sinusoidal trajectory of the particles of the beam equals 1.

For such an adjustment of the strength of said fields the dimension of the correction device, i.e. the length L, has a minimum value; this is important with a view to building in the device in a particle-optical apparatus.

A further version of the method according to the invention is characterized in that the correction device is provided with pole faces which, with the exception of the pole face for producing the uniform magnetic field, are arranged to produce exclusively electrical fields.

It is attractive to generate the desired multipole fields in the form of electrical fields as much as possible. This is because the generation of magnetic fields always requires poles of a ferromagnetic material, which poles inevitably exhibit magnetic hysteresis which, moreover, often is also time dependent, and has a non-linear magnetic behavior, i.e. the field strength of the magnetic field produced by said material is not directly proportional to the excitation current through the coils whereby said field is generated; such non-linear behavior is undesirable with a view to achieving accurate adjustment of the field. Furthermore, due to the finite magnetic permeability of these materials, the magnetic field generated by means of this material is dependent on the location in the material; in other words, the pole faces do not exactly form a surface of constant and uniform magnetic potential, so that in such a case the field shape that could be expected on the basis of the design of the pole structure will not be obtained exactly.

A particle-optical apparatus for carrying out the method according to the invention is characterized in that the means which are arranged to adapt the focusing of the beam in the event of changing focusing circumstances include a microprocessor.

This step substantially enhances the ease of use of the apparatus. Using the microprocessor, the correct settings of the two particle lenses to be adjusted can be calculated or determined in another manner. The determination of the correct settings may be based on theoretically determined formulas, on experimentally determined properties of the imaging system of the apparatus, or on a mixture of these methods. The means which are arranged to adapt the focusing of the beam in the event of changing focusing circumstances in an embodiment of the invention contain a table which stores a number of settings of the objective lens unit as a function of different focusing circumstances. The desired settings can be read from this so-called look-up table by cooperation between the microprocessor and the table and, if necessary, specifically adapted by the microprocessor to special circumstances in the apparatus.

The microprocessor in the particle-optical apparatus according to the invention is preferably arranged to achieve a desired excitation of the electromagnetic lenses of the focusing lens unit to be adjusted by interpolation between a number of settings stored in the table.

According to this method of adjustment, only a comparatively small number of settings need be stored. The microprocessor can calculate a suitable interpolation value on the basis of an algorithm stored in a memory which is also accessible to the microprocessor.

BRIEF DESCRIPTION OF THE DRAWINGS

The invention will be described in detail hereinafter with reference to the Figures. Therein.

DETAILED DESCRIPTION OF THE PREFERRED EMBODIMENTS

Figure 1:
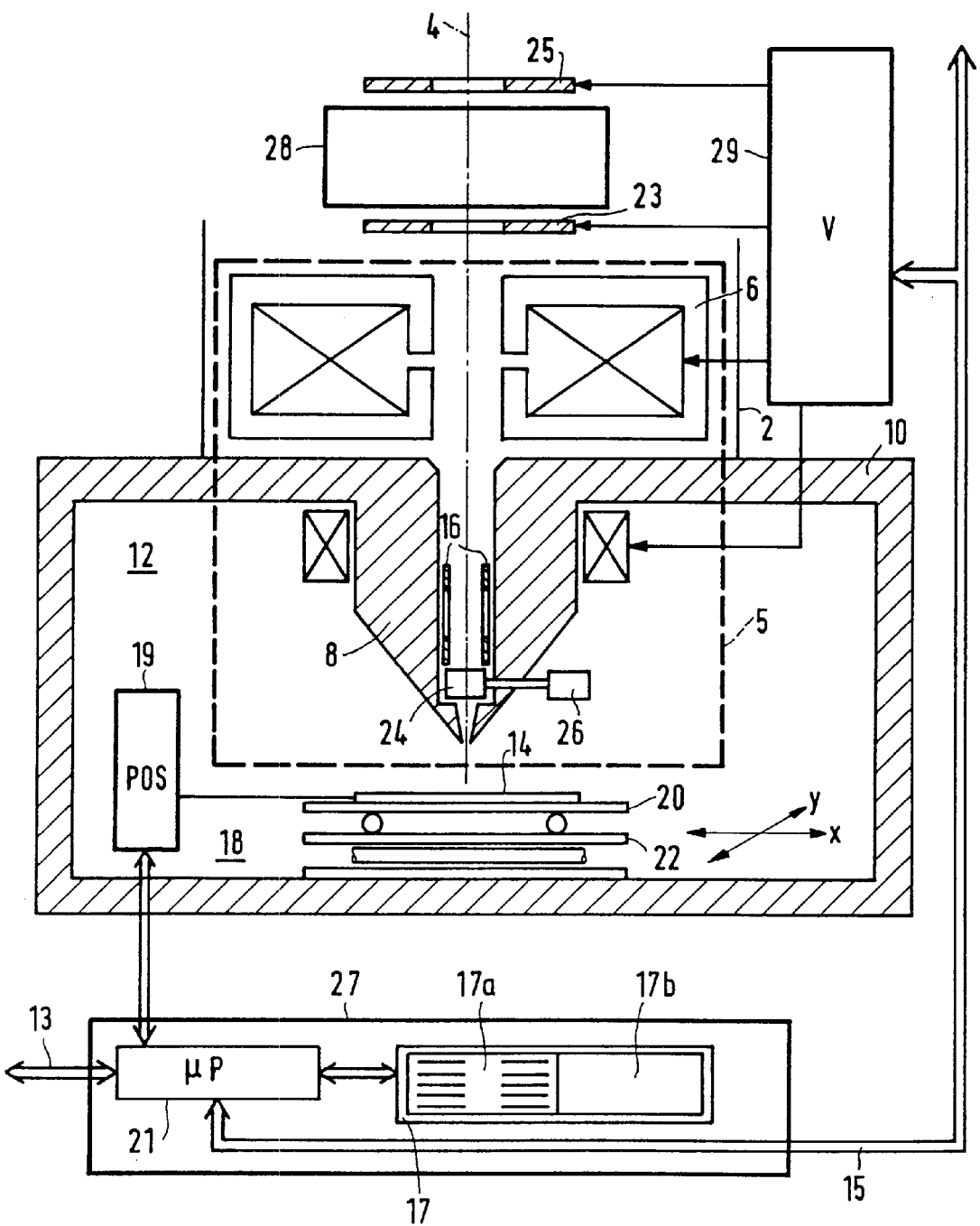
FIG. 1 shows diagrammatically a relevant part of a particle-optical instrument in which the invention can be used.

FIG. 1 shows a particle-optical instrument in the form of a part of a column 2 of a Scanning Electron Microscope (SEM). As is customary, an electron source (not shown in the Figure) in this instrument produces a beam of electrons which travels along the optical axis 4 of the instrument. The electron beam can pass through one or more condenser lenses (not shown), after which it passes through a correction device 28 which is to be described hereinafter and is arranged to correct the chromatic and/or the spherical aberration of a focusing lens unit 5. The focusing lens unit 5 consists of a doublet of two lenses 6 and 8, the lens 6 being constructed as a conventional gap lens whereas the lens 8 is constructed as an immersion lens which is also known as a monopole lens. The lens 8 forms part of a magnetic circuit which also consists of the wall 10 of the specimen chamber 12.

The focusing lens unit 5 is used to form, via the electron beam, a focus whereby an object, being the specimen 14, is scanned. Scanning takes place by moving the electron beam across the specimen in the x-direction as well as the y-direction by means of scan coils 16 provided in the objective lens 8. The specimen 14 is arranged on a specimen table 18 which comprises a carrier 20 for the x-displacement and a carrier 22 for the y-displacement. These two carriers enable selection of a desired area of the specimen for examination. Moreover, the height of the specimen, and hence the distance between the specimen and the lower side of the lens 8 (the working distance), can be adjusted to a value desired by the user of the apparatus.

In this microscope imaging is realized in that secondary electrons are released from the specimen, which secondary electrons move back in the direction of the objective lens 8. These secondary electrons are detected by a detector 24 provided in the bore of this lens. A control unit 26 which serves to activate the detector and to convert the flow of detected electrons into a signal which can be used for forming an image of the specimen, for example by means of a cathode ray tube (not shown), is connected to the detector.

The correction device 28 may be constructed as a corrector which provides optimum correction for said lens aberrations at one velocity of the electrons only. In order to allow the user to make electrons of desired energy incident on the specimen nevertheless and to make the electrons pass through the optical components preceding the correction device with a desired energy, electrodes 23 and 25 are arranged to both sides of the correction device 28 in order to accelerate or decelerate the electrons as desired, so that the electrons always pass through the correction unit 28 with the same energy. These electrodes are fed by a controllable supply source 29. The controllable supply source 29 is also capable of feeding a number of other optical components; in this respect notably the gap lens 6 and the immersion lens 8 can be mentioned.

For the control and the information processing, the electron microscope is provided with a data processing unit 27. This unit includes a microprocessor 21 and a memory unit 17 which is connected to the microprocessor. The memory unit 17 comprises memory sections 17a and 17b. The memory section 17a is used to store a table in which a number of settings of the objective lens unit 5 are stored as a function of different focusing circumstances. The memory section 17b is used to store all other information required for adjusting the optical components to be controlled, for example an algorithm for obtaining, in a desired operating state, the excitation for adjustment of the electromagnetic lenses 6 and 8 of the focusing lens unit 5, utilizing interpolation between a number of settings stored in the table 17a. The settings stored can be obtained in various ways. One way of obtaining these settings is the theoretical calculation of the excitation of the lenses 6 and 8, or the determination of these excitations by computer simulation. In practice a small further correction of the values thus obtained will be required. This correction can be implemented by accurately focusing the electron microscope in the desired practical measuring situations and by storing the excitation values thus obtained in said table.

The settings desired by the user are applied to the microprocessor via a user interface which is symbolically represented by a bus 13. The microprocessor also receives information concerning the lens excitations via a bus 15 which may also be connected to further optical components, for example in order to transmit the value of the acceleration voltage of the electron beam. The bus 15 is also used to apply the currents to be adjusted (for example, for the excitation of the lenses 6 and 8) and voltages (for example, for the electrodes 23 and 25) to the power supply source 29. Finally, information concerning the vertical position (the working distance) of the specimen 14 can be exchanged between the microprocessor and a positioning unit 19.

Figure 2:
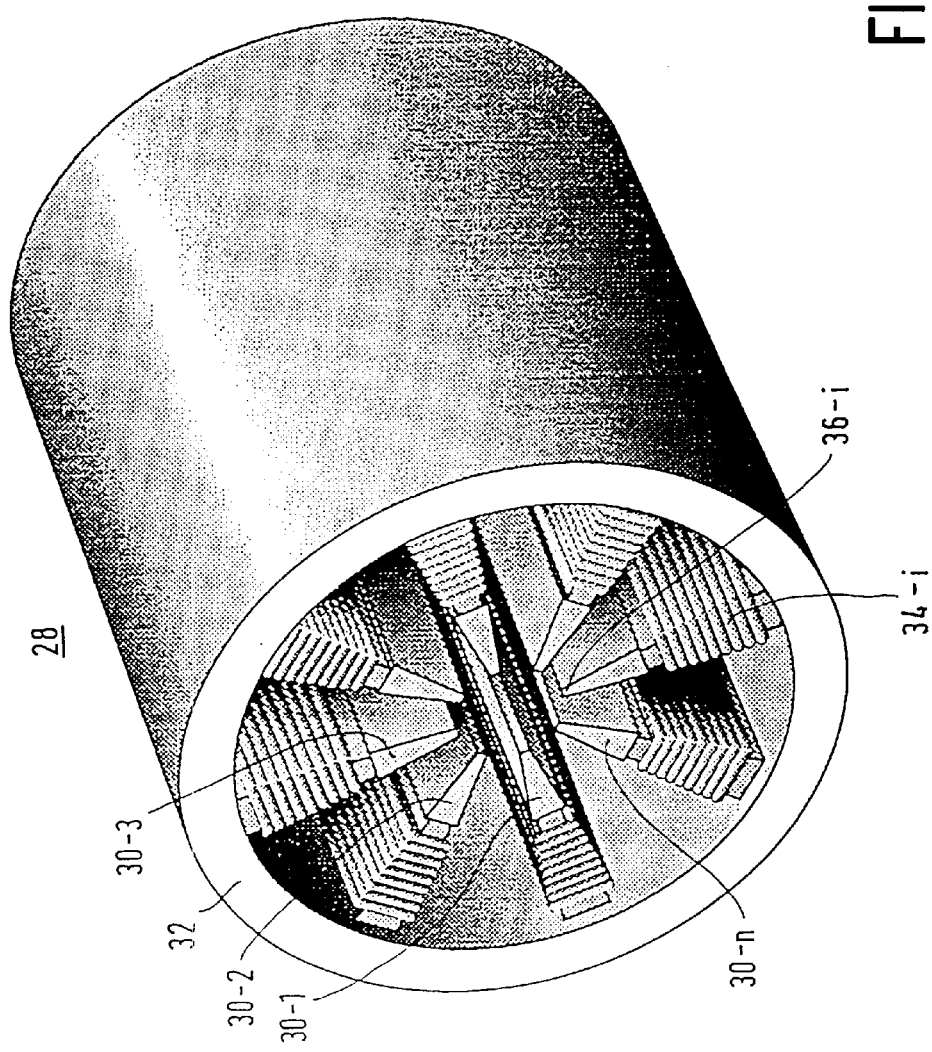
FIG. 2 is a perspective view of an embodiment of a correction device for use in a particle-optical instrument according to the invention.

FIG. 2 is a perspective view of an embodiment of a correction device for use in a particle-optical instrument, for example as denoted by the reference numeral 28 in FIG. 1. The correction device is formed by a magnetic circuit which consists of a cylindrical jacket 32 in which a number n of poles 30-1 to 30-n is provided so as to be uniformly distributed across the cylinder, n in this Figure being equal to 8. Even though in principle the implementation of the invention does not require multipole fields of an order higher than quadrupoles, for the compensation of mechanical imperfections it is desirable to have a facility for generating also higher-order fields, for example n=8 as in this Figure, while n=12 is also feasible. However, this possibility is not of essential importance to the invention. The cylinder axis of the jacket 32 coincides with the optical axis 4 of the particle-optical instrument shown in FIG. 1.

The various multipole fields, i.e. the magnetic fields as well as the electrostatic fields, are generated by means of the n poles. Each of these poles is arranged to generate an electrical as well as a magnetic field; the pole faces determining said multipole fields extend parallel to the optical axis of the apparatus. Each pole 30-i is provided with an excitation coil 34-i for generating a magnetic field and with a pole cap 36-i for generating an electrical field. Each of the excitation coils 34-i and each of the pole caps 36-i can be individually excited, so that each of the desired multipole fields, i.e. electrical fields as well as magnetic fields, can be generated by means of the eight poles 30-1 to 30-8. It is to be noted that the above correction device is described in detail in Applicant's previously filed European Patent Application No. 96 20 26 38.1 (PHN 15.991) which has not yet been published at the time of filing of the present Application.

For an explanation of the operation of the combination of the doublet of the two particle lenses 6, 8 in the focusing lens unit 5, in cooperation with a correction device such as, for example as described above, it is to be noted that, generally speaking, the coefficient of chromatic aberration $C_c$ of a lens is defined by means of the following expression:

$$\Delta(x') = \frac{C_c}{f} \cdot \frac{\Delta U}{U_0} \cdot \frac{x}{f} \quad (1)$$

The symbols in the expression (1) have the following meaning:

x is the distance between the optical axis 4 and an electron which travels parallel to this optical axis so as to be incident on the lens;

$\Delta(x')$ is the deviation, caused by the chromatic aberration, of the angle of the electron trajectory relative to the optical axis after diffraction by the lens; in that case x' (=dx/dz, where z is the location coordinate in the direction of the optical axis) is the angle of the electron trajectory relative to the optical axis;

$\Delta U/U_0$ is the deviation $\Delta U$ (expressed in an equivalent voltage measure) of the energy of an electron from the nominal energy $U_0$;

f is the focal distance of the lens (also expressed as 1/K, being the reciprocal strength of the lens).

The corrective effect of the correction device 28 consists in that the correction device imparts an angular deviation to the electron beam incident on the focusing lens unit 5 such that the radius of the dispersion circle in the electron spot, caused by the chromatic aberration, equals zero. Because said radius of the dispersion circle is proportional to the angular deviation $\Delta(x')$ and this angular deviation is proportional to the distance x, therefore, the variables $(\Delta(x'))/x$ of the correction device 28 as well as of the focusing lens unit 5 should be equal and have the opposite sign (for a given value of $\Delta U/U_0$). When the expression (1) is divided by x (or written as a function of $\{\Delta(x')\}/x$), it appears that this situation is reached if $C_c/f^2$, or $C_c/K^2$, (for a given value of $\Delta U/U_0$) is kept equal and opposed for the correction device 28 and for the focusing lens unit 5 during operation of the microscope. Since the aim is to keep the setting of the correction device constant, therefore, the value of $C_c/K^2$ of the focusing lens unit 5 should be maintained constant during operation of the microscope.

Figure 3:
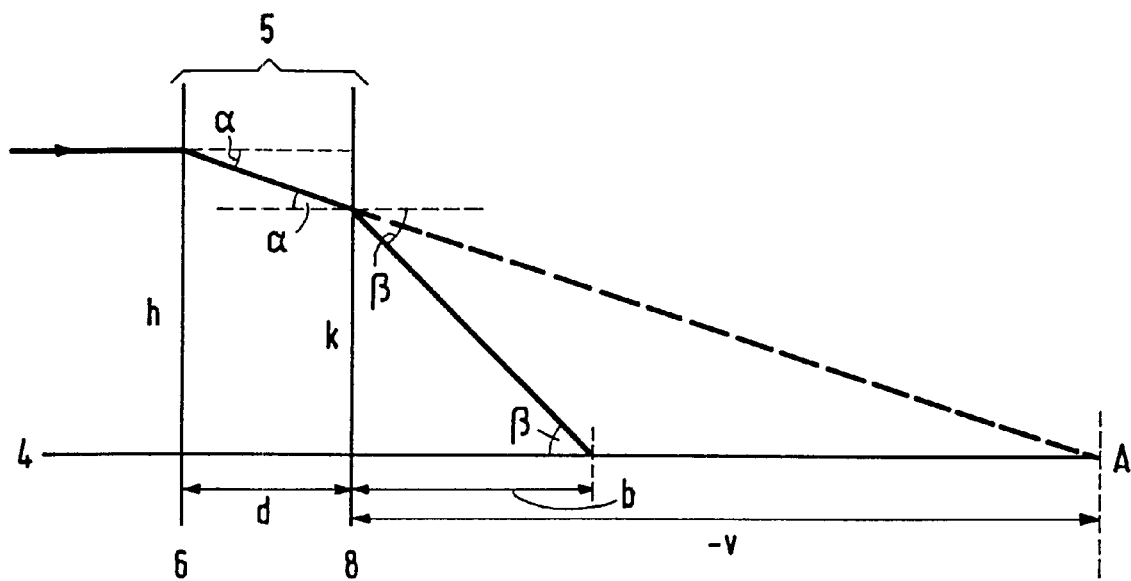
FIG. 3 shows diagrammatically the trajectory of an electron beam in a system consisting of two lenses.

Hereinafter it will be described how this can be realized by controlling the individual excitation of each of the lenses 6 and 8 of the system 5. To this end, first it will be explained how the chromatic aberration of a lens system is dependent on each of the chromatic aberrations of the two lenses in this system. Reference is made to FIG. 3 for this purpose. This Figure shows diagrammatically the course of an electron trajectory in an optical system 5 which includes two lenses 6 and 8 as used in a SEM. The two lenses 6 and 8 in this Figure are shown diagrammatically as a straight line with a spacing d. An electron beam which travels parallel to the optical axis 4 is incident on the lens 6 at a height h, after which this ray is diffracted at an angle $\alpha$ in the direction of the optical axis 4. The diffracted electron beam is subsequently diffracted further in the direction of the optical axis 4 by the lens 8 at an angle $\beta$ with respect to this optical axis. If the diffraction by the lens 8 were absent, the beam diffracted exclusively by the lens 6 would intersect the axis 4 only at point A. Because the point A is an object point to be imaged by the lens 8 and this point is situated behind the lens 8, the distance from the lens 8 is provided with a minus sign, so -v. It can now be demonstrated that the value of the angle $\beta$ is subject to:

$$\beta = \frac{k}{f_2} + \alpha \quad (2)$$

$f_2$ in the expression (2) is the focal distance of the lens 8. Furthermore, for the height k it holds that:

$$k = h - \alpha d \quad (3)$$

wherefrom it follows for the deviation $\Delta k$ caused by the chromatic aberration of the lens 6 that:

$$\Delta k = -d \cdot \Delta \alpha \quad (4)$$

$\Delta\alpha$ in the expression (4) is the deviation of the angle $\alpha$ due to the chromatic aberration of the lens 6.

The deviation of the angle $\beta$ is caused by the deviations $\Delta k$, $\Delta f_2$ and $\Delta \alpha$ of the variables k, $f_2$ and $\alpha$, respectively, so that the deviation $\Delta\beta$ can be written as:

$$\Delta\beta = \left(\frac{\partial \beta}{\partial k}\right)\Delta k + \left(\frac{\partial \beta}{\partial f_2}\right)\Delta f_2 + \left(\frac{\partial \beta}{\partial \alpha}\right)\Delta\alpha \quad (5)$$

Using the expression (2), the differential quotients of the expression (5) can be calculated. This yields the following expression:

$$\Delta\beta = \left(\frac{1}{f_2}\right)\Delta k - \left(\frac{k}{f_2^2}\right)\Delta f_2 + \Delta\alpha \quad (6)$$

As an expression for $\Delta f_2$ can be obtained on the basis of the definition equation (1) for the chromatic aberration if $\Delta\alpha$, $C_2$, $f_2$, $\delta U$ and h are inserted therein for $\Delta(x')$, $C_c$, f, $(\Delta U)/U_0$ and x, respectively. The expression (1) then becomes:

$$\Delta\alpha = \frac{C_2}{f_2} \cdot \delta U \cdot \frac{h}{f_2} \quad (7)$$

Furthermore, it is known that for a beam which is incident on a lens parallel to the optical axis at a height h, it generally holds that the diffraction angle $\alpha$ equals h/f; when applied to the lens 8, this yields:

$$\Delta\alpha = -\alpha \cdot \frac{\Delta f_2}{f_2} \quad (8)$$

Equation of the expressions (7) and (8) yields, while applying $\alpha = h/f_2$:

$$\Delta f_2 = C_2 \delta U \quad (9)$$

By insertion of the expressions (3), (8) and (9) for k, $\Delta\alpha$ and $\Delta f_2$, respectively, in the expression (6) for $\Delta\beta$, the following expression is obtained for $\Delta\beta$:

$$\Delta\beta = \left\{\left(1 - \frac{d}{f_2}\right)\frac{C_1}{f_1^2} + \left(1 - \frac{d}{f_1}\right)\frac{C_2}{f_2^2}\right\} \cdot h \cdot \delta U \quad (10)$$

Using the paraxial imaging equation $(1/b + 1/v = 1/f)$, it can be deduced in FIG. 3 that the following holds for b:

$$b = \frac{f_2(f_1 - d)}{f_1 + f_2 - d} \quad (11)$$

Figure 4:
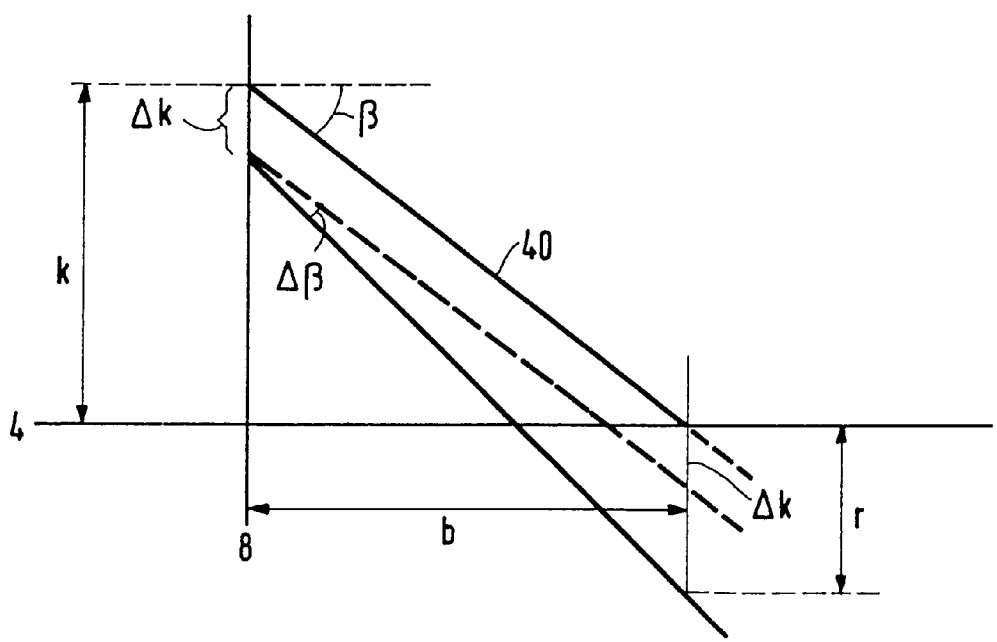
FIG. 4 shows diagrammatically the trajectory of an electron beam near the last lens of a two-lens system, with as well as without chromatic aberration.

In order to enable determination of the magnitude of the dispersion circle of the chromatic aberration which is due to the total chromatic aberration of the lens system 5, reference is made to FIG. 4. This Figure shows diagrammatically the second lens of the system with a first beam which would occur in the absence of chromatic aberration in the first lens 6 as well as in the second lens 8 of the system 5. Due to the chromatic aberration of the first lens 6, the incident electron beam is imparted a deviation $\Delta k$ already before the lens 8 and the chromatic aberration of the lens 8 imparts a further angular deviation $\Delta\beta$ with respect to the diffraction angle $\beta$ to this beam. Both variables $\Delta k$ and $\Delta\beta$ influence the value of the radius r of the dispersion circle in conformity with the expression:

$$r = \Delta k + b \cdot \Delta\beta \quad (12)$$

In accordance with the expression (4), $-d \cdot \Delta\alpha$. According to the principle described with reference to the expression (7), the following can be written for $\Delta\alpha$:

$$\Delta\alpha = \frac{C_1}{f_1} \cdot \delta U \cdot \frac{h}{f_1} \quad (13)$$

wherefrom $\Delta\alpha$ is eliminated by equating $\Delta\alpha$ to $-(\Delta k)/d$ (see expression (4); the following expression is then obtained for $\Delta k$:

$$\Delta k = \left(\frac{-C_1 d}{f_1^2}\right) \cdot h \cdot \delta U \quad (14)$$

The expression (14) can then be inserted for $\Delta k$ in the expression (12); for the variable b the expression (11) can be inserted and the expression (10) can be inserted for $\Delta\beta$. For the radius of the dispersion circle r there is thus obtained an expression which is dependent only on the optical parameters $(f_1, f_2, C_1, C_2)$, the distances (d, b, h) in the system, and the relative energy spread $(\delta U)$ in the beam:

$$r = \left[\frac{C_1 d}{f_1^2} + b\left\{\left(1 - \frac{d}{f_2}\right)\frac{C_1}{f_1^2} + \left(1 - \frac{d}{f_1}\right)\frac{C_2}{f_2^2}\right\}\right] \cdot h \cdot \delta U \quad (15)$$

According to the definition of the coefficient of chromatic aberration, the following holds for the radius r of the dispersion circle due to the chromatic aberration of the entire system 5:

$$r = f_t \cdot \Delta(x) = f_t \cdot \frac{C_t}{f_t} \cdot \delta U \cdot \frac{h}{f_t} \quad (16)$$

in which $f_t$ is the focal distance of the overall system and $C_t$ is the coefficient of chromatic aberration of the overall system.

When the expression (16) is equated to the above expression for r, formed on the basis of the expressions (10), (11), (12) and (14), r is eliminated from these equations; an equation is then obtained for $C_t$:

$$C_t = \frac{C_1 K_1^2}{K_t^2} + \frac{C_2 K_2^2}{K_t^2}\{1 - 2dK_1 + d^2 K_1^2\} \quad (17)$$

For imaging the lens 8 exhibits a given angular enlargement M which is dependent on the strength of each of the lenses 6 and 8 of the system and on the distances b and d (FIG. 3). Utilizing the angular enlargement M, the strength $K_1$ of the lens 6 can be written as:

$$K_1 = \frac{1}{Mb + d} \quad (18)$$

and the strength $K_2$ of the lens 8 as:

$$K_2 = \frac{M - 1}{Mb} \quad (19)$$

Finally, by inserting the expressions (18) and (19) in the expression (17) the relationship is obtained between the coefficient of chromatic aberration $C_t$ of the overall system 5 and the relevant coefficients $C_1$ and $C_2$ of the lenses 6 and 8, respectively:

$$C_t = \frac{1}{M^2} \cdot C_1 + \left(\frac{M-1}{M^2}\right)^2 \cdot C_2 \quad (20)$$

As is generally known in electron optics, the coefficient of chromatic aberration of an electron lens during normal operation can be suitably approximated by the expression $C \approx 1/K$, so that for the lenses 6 and 8 it holds that $C_1 1/K_1$ and $C_2 1/K_2$, respectively. By inserting the latter values for $C_1$ and $C_2$ in the expression (20), in which the values according to the expressions (18) and (19) are also taken for $K_1$ and $K_2$, respectively, the following expression is obtained for $C_t K_t^2$:

$$C_t K_t^2 = \frac{d + M^2 b}{(d + bM)^2} \quad (21)$$

Finally, from the expression (21) the settings of the two lenses 6 and 8 can be derived so as to satisfy the condition for correction of the chromatic aberration, regardless of the value of b (the free object distance).

The procedure is then as follows. The variable b, being the free object distance, is a variable specified by the user of the apparatus on the basis of the examinations to be performed by means of the apparatus. This means that b is to be considered as a given variable. Furthermore, the variable d, being the distance between the lenses 6 and 8, is then also fixed during operation of the apparatus. In that case $C_t K_t^2$ can still be chosen by separately choosing the strengths $K_1$ and $K_2$; in other words, the condition that the product $C_t K_t^2$ must remain constant can be satisfied by means of a number of combinations of $K_1$ and $K_2$. Once a value has been chosen for $C_t K_t^2$, the angular enlargement M must be adjusted so that the expression (21) is satisfied. This is achieved by utilizing the expressions (18) and (19) which provide the strength of each of the lenses 6 and 8, for given b and d, in dependence on the angular enlargement M.

A practical implementation of the invention is the following. A sharp image is formed with a suitably chosen setting of the correction device 28 and using the above knowledge of the excitation of the system 5. Generally, a slight adaptation of the excitation of the lenses 6 and 8 will then be required still. The working distance b and the acceleration voltage U are subsequently varied. The setting of the correction device 28 is meanwhile maintained constant. Focusing of the system 5 is then controlled by means of the system 5, using the expression (21), and minor corrections, if any, to be performed thereon still. For a number of values of the acceleration voltage U and a number of values of the free object distance b the associated values of the lens excitation of each of the lenses 6 and 8 is stored in a table 17a in a memory 17 (see FIG. 1). During use of the apparatus, a desired setting of the lenses 6 and 8 (which desired setting, generally speaking, will not coincide with the settings used for drafting the table) can be realized by interpolation between two neighboring values from the table.

It is to be noted that in order to keep the adjustment of the correction unit 28 constant, the electrons should always travel through this unit at the same velocity, i.e. the same potential. In order to satisfy this requirement in the case of a varying acceleration voltage, it is necessary to provide additional means for accelerating or decelerating the electrons upstream or downstream of the correction unit 28. Such a low acceleration voltage could be chosen upstream of the correction unit 28 that downstream of this unit only post-acceleration would be required. In that case there must be provided post-acceleration electrodes (not shown in the Figure) which may be constructed as mutually parallel flat plates which extend perpendicularly to the optical axis 4 and are provided with an aperture at the area of the optical axis. The post-acceleration voltage can be applied between these plates. In that case a lens effect occurs in addition to the acceleration of the electron beam. The appearance of the expression (21) then changes, because a factor which represents the lens effect of the accelerating field is added to the left-hand term of this expression:

$$C_t K_t^2 \sqrt{\frac{U_c}{U_{final}}} = \frac{d + M^2 b}{(d + bM)^2} \sqrt{\frac{U_c}{U_{final}}} \quad (22)$$

in which $U_c$ is the potential of the electrons in the correction unit 28 and $U_{final}$ is the potential of the electrons after post-acceleration, i.e. the potential of the electrons upon incidence on the specimens 14. In this expression (22) the product $$C_t K_t^2 \sqrt{\frac{U_c}{U_{final}}}$$

must then be kept constant.

We claim:

1. A method of operating a particle-optical apparatus, which apparatus includes:

a particle source for emitting a beam of electrically charged particles which travel along an optical axis (4) of the apparatus in order to irradiate an object (14) in the apparatus by means of particle beam, which particle source includes an acceleration unit for accelerating the beam of electrically charged particles by means of an acceleration voltage, a focusing lens unit (5) which is formed by a combination of at least two particle lenses (6, 8) and serves to focus the beam of electrically charged particles, and a correction device (28) for correcting chromatic and/or spherical aberration of the focusing lens unit (5), comprising the step of adapting the focusing of the beam, as the focusing circumstances change, by changing the excitation of at least two of the electromagnetic lenses (6, 8) of the focusing lens unit (5), the product $$C_t K_t^2 \sqrt{\frac{U_c}{U_{final}}}$$

being kept constant for this adaption, $C_t$ being the coefficient of chromatic aberration of the focusing lens unit (5), $K_t^2$ the square of the strength of the focusing lens unit (5), and $\sqrt{(U_c/U_{final})}$ the root of the ratio of the voltage of the electrons in the correction unit (28) to the voltage of the electrons on the object (14).

2. A method as claimed in claim 1, where the correction device (28) is provided with pole faces (30-i) for producing a uniform electrical field and a uniform magnetic field which extends perpendicularly thereto, both of said dipole fields also extending perpendicularly to the optical axis (4) of the apparatus, which correction device (28) is also provided with pole faces (30-i) for producing an electrical quadrupole field, said pole faces (30-i) extending substantially parallel to the optical axis (4) of the apparatus, and the excitation of the correction device (28), the excitation of the focusing lens unit (5), the velocity of the electrically charged particles, and the length L, in the direction of the optical axis (4), of the pole faces (30-i) determining the multipole fields are chosen so that for said length L it holds that it is substantially equal to $(2\pi^2 n^2)/(K_t^2 C_t)$, where n is the number of periods of the sinusoidal trajectory of the particles of the beam in the correction device, $K_t$ is the strength of the focusing lens unit (5) to be corrected, and $C_t$ is the coefficient of chromatic aberration of this lens unit.

3. A method as claimed in claim 2, where such a strength is imparted to the dipole fields of the correction device (28) that the number of periods n of the sinusoidal trajectory of the particles of the beam equals 1.

4. A method as claimed in claim 3, where the correction device (28) is provided with pole faces (30-i) which, with the exception of the pole face for producing the uniform magnetic field, are arranged to produce exclusively electrical fields.

5. A particle-optical apparatus comprising:

a particle source for emitting a beam of electrically charged particles which travel along an optical axis (4) of the apparatus in order to irradiate an object (14) in the apparatus by means of particle beam, which particle source includes an acceleration unit for accelerating the beam of electrically charged particles by means of an acceleration voltage, a focusing lens unit (5) which is formed by a combination of at least two particle lenses (6, 8) and serves to focus the beam of electrically charged particles, and a correction device (28) for correcting chromatic and spherical aberration of the focusing lens unit (5), and means (27) for adapting the focusing of the beam, in the event of changing focusing circumstances, by changing the excitation of at least two of the lenses (6, 8) of the focusing lens unit (5), while keeping product $$C_t K_t^2 \frac{\sqrt{UC}}{U_{final}}$$

constant, $C_t$ being the coefficient of chromatic aberration of the focusing lens unit (5), $K_t^2$ being the square of the strength of the focusing lens unit (5), and $\sqrt{(U_c/U_{final})}$ being the root of the ratio of a voltage of the electrons in the correction unit (28) of the voltage of the electrons on the object (14).

6. A particle-optical apparatus as claimed in claim 5, in which one of the at least two electromagnetic lenses, is formed by a spot-forming immersion lens.

7. A particle-optical apparatus as claimed claim 5, which particle-optical apparatus is constructed as a scanning particle-optical apparatus which includes a spot-forming objective lens unit (5) and in which the correction device (28) is arranged ahead of the objective lens unit (5).

8. A particle-optical apparatus as claimed in claim 5, said means for focusing the charged particle beam further include a microprocessor.

9. A particle-optical apparatus as claimed in claim 8, wherein said means for focusing the charged particle beam further include a table in which one or more settings of the objective lens unit (5) are stored as a function of different focusing circumstances.

10. A particle-optical apparatus as claimed in claim 9, in which the microprocessor (21) is arranged to achieve a desired excitation of the electromagnetic lenses (6, 8) of the focusing lens unit (5) to be adjusted by interpolation between a plurality of settings stored in the table (17*a*).

* * * * *